(12) United States Patent
Kim et al.

(10) Patent No.: US 8,552,635 B2
(45) Date of Patent: Oct. 8, 2013

(54) PIXEL ARRANGEMENT OF AN ORGANIC LIGHT EMITTING DISPLAY DEVICE

(75) Inventors: Gun-Shik Kim, Yongin (KR); Jun-Sik Oh, Yongin (KR); Jae-Shin Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 12/929,528

(22) Filed: Jan. 31, 2011

(65) Prior Publication Data

US 2011/0291550 A1 Dec. 1, 2011

(30) Foreign Application Priority Data

May 26, 2010 (KR) .................. 10-2010-0048942

(51) Int. Cl.
*H01L 51/52* (2006.01)
(52) U.S. Cl.
USPC ......................................................... 313/504
(58) Field of Classification Search
USPC .............. 257/40, 72, 98–100, 642–643, 759;
313/498–512; 315/169.1, 169.3, 169.2;
427/58, 64, 66, 532–535, 539;
428/690–691, 917; 438/26–29, 34, 82,
438/455; 445/24–25; 345/100, 698;
349/109
See application file for complete search history.

(56) References Cited

U.S. PATENT DOCUMENTS

| | | | |
|---|---|---|---|
| 6,747,618 B2 * | 6/2004 | Arnold et al. | 345/77 |
| 7,515,122 B2 * | 4/2009 | Miller et al. | 345/76 |
| 2004/0070332 A1 * | 4/2004 | Miller et al. | 313/498 |
| 2007/0205423 A1 * | 9/2007 | Yamazaki et al. | 257/89 |
| 2008/0001525 A1 * | 1/2008 | Chao et al. | 313/500 |
| 2009/0121983 A1 | 5/2009 | Sung et al. | |
| 2009/0289963 A1 * | 11/2009 | Minami et al. | 345/690 |
| 2010/0096988 A1 * | 4/2010 | Kitabayashi et al. | 315/51 |

FOREIGN PATENT DOCUMENTS

| | | |
|---|---|---|
| JP | 04-298713 A | 10/1992 |
| JP | 11-150252 A | 6/1999 |
| JP | 2003-168561 A | 6/2003 |
| JP | 2005-352147 A | 12/2005 |
| JP | 2006-059796 A | 3/2006 |
| JP | 2009-282190 A | 12/2009 |
| KR | 10 2003-0042603 A | 6/2003 |
| KR | 10 2004-0080442 A | 9/2004 |
| KR | 10 2006-0094092 A | 8/2006 |
| KR | 10 2007-0017349 A | 2/2007 |
| KR | 10 2010-0001598 A | 1/2010 |

OTHER PUBLICATIONS

Japanese Office action, dated Jun. 5, 2012, for Japanese Patent Application No. 2011-117556. (Gun-Shik Kim, et al.).

* cited by examiner

*Primary Examiner* — Donald Raleigh
(74) *Attorney, Agent, or Firm* — Lee & Morse, P.C.

(57) ABSTRACT

A pixel arrangement of an organic light emitting display device with a plurality of repeatedly arranged sub-pixel groups, each of the sub-pixel groups includes two first sub-pixels in i-th and (i+2)-th columns (i is a natural number), two second sub-pixels in the i-th and (i+2)-th columns, the second sub-pixels being arranged in different rows with respect to the first sub-pixels, and two third sub-pixels in (i+1)-th and (i+3)-th columns, each third sub-pixel being arranged to overlap at least two adjacent rows of the first and second sub-pixels.

16 Claims, 5 Drawing Sheets

PIXEL ARRANGEMENT OF AN ORGANIC LIGHT EMITTING DISPLAY DEVICE

BACKGROUND

1. Field

The embodiment relates to a pixel arrangement of an organic light emitting display device, and more particularly, to a pixel arrangement of an organic light emitting display device with an improved aperture ratio and a high-resolution.

2. Description of the Related Art

An organic light emitting display device displays images by using an organic light emitting diode (OLED), i.e., an auto emission device, and has been noticed as a next generation display device due to its excellent luminance and color purity. The organic light emitting display device may display images of various colors by using red sub-pixels, green sub-pixels, and blue sub-pixels.

SUMMARY

Embodiments are directed to a pixel arrangement of an organic light emitting display device, which substantially overcome one or more of the problems due to the limitations and disadvantages of the related art.

It is therefore a feature of an embodiment to provide a pixel arrangement of an organic light emitting display device with a secured aperture ratio while having a high-resolution.

At least one of the above and other features and advantages may be realized by providing a pixel arrangement of an organic light emitting display device with a plurality of repeatedly arranged sub-pixel groups, each of the sub-pixel groups including two first sub-pixels in i-th and (i+2)-th columns (i is a natural number), two second sub-pixels in the i-th and (i+2)-th columns, the second sub-pixels being arranged in different rows with respect to the first sub-pixels, and two third sub-pixels in (i+1)-th and (i+3)-th columns, each third sub-pixel being arranged to overlap at least two adjacent rows of the first and second sub-pixels.

The third sub-pixel may be at least two times longer than the first sub-pixel along a column direction. The third sub-pixel may have a wider area than the first sub-pixel. The third sub-pixel may be set up as a sub-pixel with the shortest life property among a red sub-pixel, a green sub-pixel, and a blue sub-pixel. The third sub-pixel may be a blue sub-pixel, the first sub-pixel may be a red sub-pixel, and the second sub-pixel may be a green sub-pixel. The first sub-pixel and the second sub-pixels may be alternately arranged in a same column. The first sub-pixel and the second sub-pixels may be alternately arranged in a same row. The first sub-pixels and the second sub-pixels may be arranged in separate adjacent rows.

At least one of the above and other features and advantages may also be realized by providing a pixel arrangement of an organic light emitting display device, including first and second sub-pixels arranged alternately in a plurality of columns, the first and second sub-pixels being configured to emit different colors, and third sub-pixels between adjacent columns of alternating first and second sub-pixels, each third sub-pixel overlapping four alternating first and second sub-pixels within a same column.

Third sub-pixels in adjacent columns may overlap only partially. Each third sub-pixel may overlap a portion of a third sub-pixel in an adjacent column that corresponds to two alternating first and second sub-pixels within a same column. The third sub-pixel may be wider than the first sub-pixel. The third sub-pixel may be set up as a sub-pixel with the shortest life property among a red sub-pixel, a green sub-pixel, and a blue sub-pixel. The third sub-pixel may be a blue sub-pixel, the first sub-pixel may be a red sub-pixel, and the second sub-pixel may be a green sub-pixel. The first sub-pixels and the second sub-pixels may be alternately arranged in a same row. The first sub-pixels and the second sub-pixels may be arranged in separate rows adjacent to each other.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
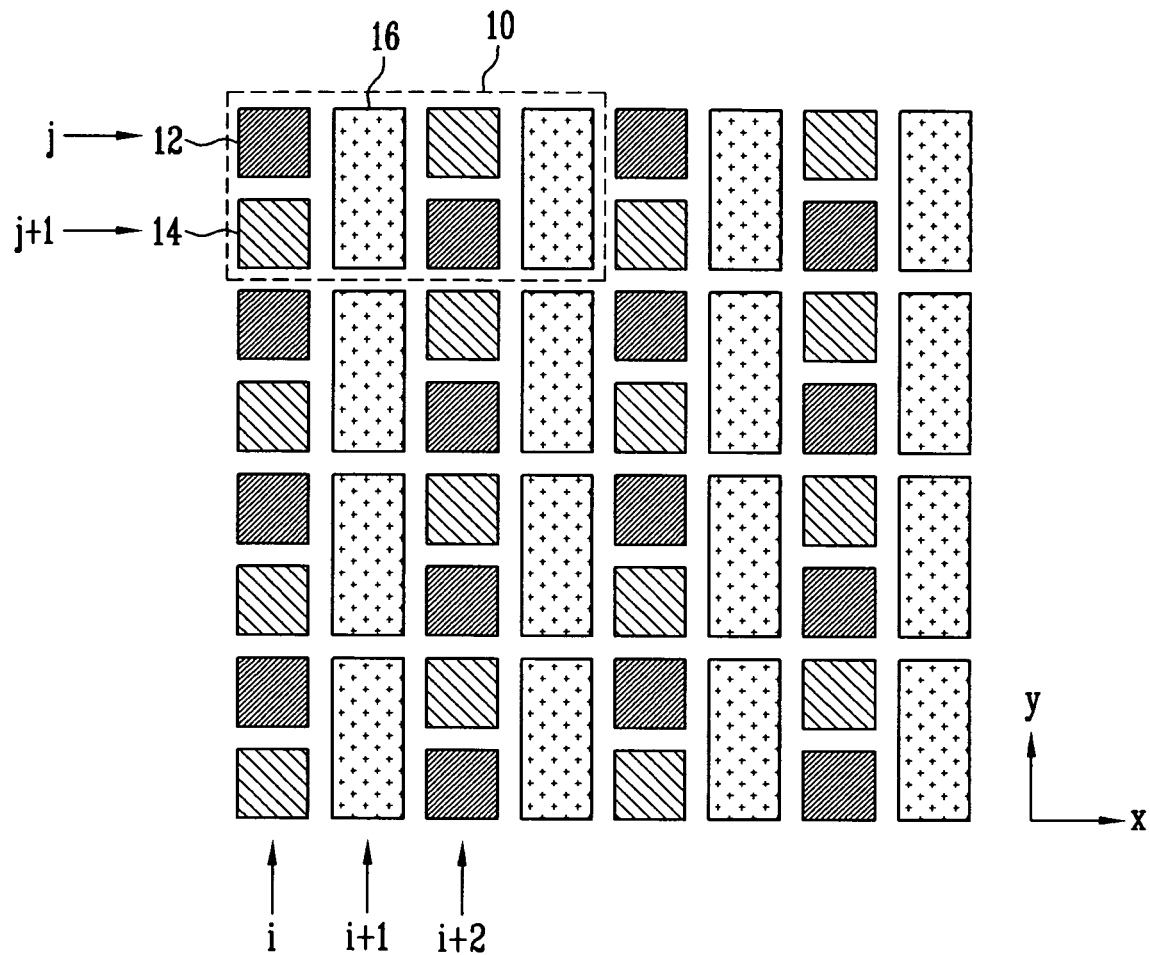
FIG. 1 illustrates a plan view of a pixel arrangement of an organic light emitting display device according to a first embodiment.

Korean Patent Applications No. 10-2010-0048942, filed on May 26, 2010, in the Korean Intellectual Property Office, and entitled: "Pixel Array for Organic Light Emitting Display Device" is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will be understood that when an element is referred to as being "between" two elements, it can be the only element between the two elements, or one or more intervening elements may also be present. Like reference numerals refer to like elements throughout.

FIG. 1 illustrates a plan view of a pixel arrangement of an organic light emitting display device according to a first embodiment. Referring to FIG. 1, the pixel arrangement of the organic light emitting display device according to the first embodiment may have a configuration that is repeatedly arranged with a plurality of sub-pixel groups 10 including sub-pixels 12, 14, 16.

A first sub-pixel 12 emits a first color light, a second sub-pixel 14 emits a second color light, and a third sub-pixel 16 emits a third color light. As discussed previously, the first sub-pixel 12, the second sub-pixel 14, and the third sub-pixel 16 may be included in the sub-pixel group 10. That is, two of each sub-pixels 12, 14, and 16 may be included in the sub-pixel group 10, and may be repeatedly arranged in a constant pattern.

The first sub-pixel 12 and the second sub-pixel 14 may be alternately arranged along a first direction in a same column line, e.g., along the y-axis. The third sub-pixel 16 may be arranged along the first direction in a column line adjacent to the column of the alternating first sub-pixels 12 and second sub-pixels 14.

The first sub-pixels 12 and the second sub-pixels 14 may be arranged in a diagonal direction among the first sub-pixels 12 and among the second sub-pixels 14 around the column lines of the third sub-pixels 16, and may also be arranged in a check type. In other words, the first sub-pixels 12 and the second sub-pixels 14 may be alternately arranged along a second direction in a same row line, e.g., along the x axis, to define an alternating matrix pattern of first and second sub-pixels 12 and 14, e.g., a first sub-pixel 12 may be separated from an adjacent first sub-pixel 12 along the first and second directions via second sub-pixels 14, while being directly adjacent to a first sub-pixel 12 along the diagonal direction.

The third sub-pixels 16 may be formed in two lines to be adjacent to the first sub-pixels 12 and the second sub-pixels 14, respectively. In other words, each third sub-pixel 16 may extend along, e.g., overlap, two row lines of the first and second sub-pixels 12 and 14. In this case, the third sub-pixels 16, e.g., each third sub-pixel 16, may be at least two times longer along the first direction, i.e., along the y-axis, than, e.g., each of, the first sub-pixels 12 (or the second sub-pixels 14). The third sub-pixel 16 may have a wider area, as compared with each of the first sub-pixel 12 and the second sub-pixel 14.

The arrangement of the first sub-pixels 12, the second sub-pixels 14, and the third sub-pixels 16 in one of sub-pixel groups 10 may be described in more detail as follows. The sub-pixel group 10 may be configured to include two first sub-pixels 12, two second sub-pixels 14, and two third sub-pixels 16 that are arranged in four column lines and two row lines.

For example, one first sub-pixel 12 and one second sub-pixel 14 in the sub-pixel group 10 may be sequentially arranged in an i-th (here, i is a natural number) column to correspond to two rows, e.g., j-th and (j+1)-th rows, and one third sub-pixel 16 may be arranged in an (i+1)-th column to correspond to two rows, i.e., to overlap the first and second sub-pixels 12 and 14 in the j-th and (j+1)-th rows. Another second sub-pixel 14 and first sub-pixel 12 may be sequentially arranged in an (i+2)-th column, and another third sub-pixel 16 may be arranged in an (i+3)-th column to complete the sub-pixel group 10.

Using the pixel arrangement as mentioned above, it may be possible to have a high-resolution, e.g., as compared to a sub-pixel configuration by a sub-pixel rendering way. In addition, using the pixel arrangement as mentioned above, an area of a black matrix may be reduced, thereby securing a high aperture ratio, e.g., as compared with a conventional stripe configuration.

Figure 2:
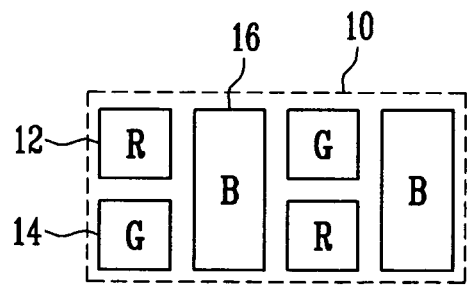
FIG. 2 illustrates a plan view of an example of a color arrangement that can be applied in a sub-pixel group of FIG. 1.

FIG. 2 illustrates a plan view of an example of a color arrangement that can be applied in the sub-pixel group 10 of FIG. 1. Referring to FIG. 2, the first sub-pixel 12 may be set up as a red sub-pixel R, the second sub-pixel 14 may be set up as a green sub-pixel G, and the third sub-pixel 16 may be set up as a blue sub-pixel B.

In general, the blue sub-pixel in a conventional organic light emitting display device has the shortest life. Therefore, the life property of the blue sub-pixel B according to example embodiments may be improved by setting up the third sub-pixel 16 as the blue sub-pixel B, in which the third pixel 16 has the largest area according to an embodiment.

Figure 3:
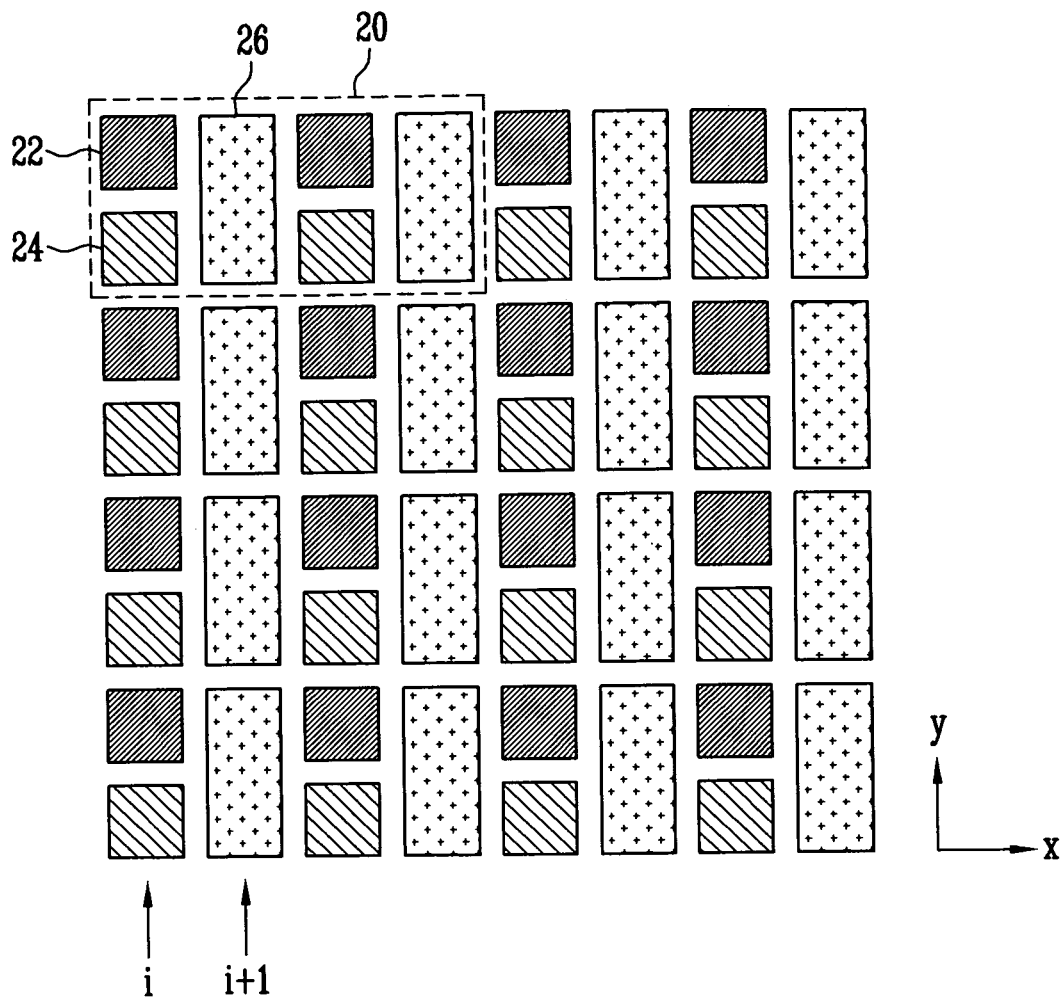
FIG. 3 illustrates a plan view of a pixel arrangement of an organic light emitting display device according to a second embodiment.

FIG. 3 illustrates a plan view of a pixel arrangement of an organic light emitting display device according to a second embodiment. As the second embodiment is similar to the first embodiment described previously with reference to FIG. 1, mostly differences between the first and second embodiments will be explained hereinafter.

Referring to FIG. 3, the pixel arrangement of the organic light emitting display device according to the second embodiment may include a repeatedly arranged configuration with a plurality of sub-pixel groups 20. Each sub-pixel group 20 may include sub-pixels 22, 24, 26. For example, each sub-pixel group 20 may include two first sub-pixels 22, two second sub-pixels 24, and two third sub-pixels 26, which may be repeatedly arranged in a constant pattern.

The first sub-pixel 22 and the second sub-pixel 24 may be alternately arranged in a same column line, e.g., along the y-axis. The third sub-pixel 26 may be arranged in a column line adjacent to the column line of the first and second sub-pixels 22 and 24. As opposed to the first embodiment, a plurality of each of the first and second sub-pixels 22 and 24 may be arranged in a same row along the x-axis. For example, a plurality of the first sub-pixels 22 may be arranged along a first row along the x-axis, and a plurality of second sub-pixels 24 may be arranged along a second row, i.e., a row adjacent to the first row, along the x-axis. As such, the third sub-pixels 26 may be positioned between adjacent first sub-pixels 22 in the first row and between adjacent second sub-pixels 24 in the second row.

Each third sub-pixel 26 may be formed to extend along two row lines to be adjacent to the first sub-pixel 22 and the second sub-pixel 24, respectively. In this case, a length, i.e., height, of the third sub-pixel 26 along the first direction may be at least two times longer than a length of the first sub-pixels 22 (or the second sub-pixel 24) along the first direction. The third sub-pixel 26 may have a wider area than each of the first sub-pixel 22 and second sub-pixel 24.

In detail, the sub-pixel group 20 may include, e.g., consist of, two of the first sub-pixels 22, two of the second sub-pixels 24, and two of the third sub-pixels 26. The sub-pixels within the sub-pixel group 20 may be arranged in two rows and four columns.

For example, one of the first sub-pixels 22 and one of the second sub-pixels 24 may be sequentially arranged in the i-th column to correspond to two rows, and one third sub-pixel 26 may be arranged in the (i+1)-th column to correspond to the two rows of the first and second sub-pixels 22 and 24 of the i-th column. The first sub-pixel 22 and the second sub-pixel 24 may be sequentially arranged in the (i+2)-th column, and the third sub-pixel 26 may be arranged in the (i+3)-th column to correspond to the same rows of the first and second sub-pixels 22 and 24 of the (i+2)-th column.

Figure 4:
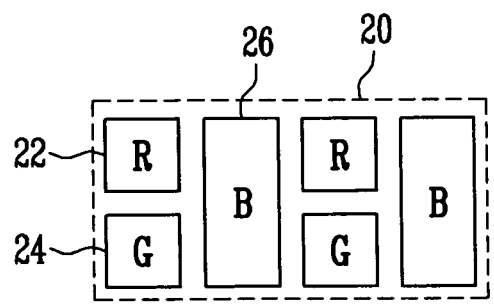
FIG. 4 illustrates a plan view of an example of a color arrangement that can be applied in a sub-pixel group of FIG. 3.

FIG. 4 illustrates a plan view of an example of a color arrangement that can be applied in the sub-pixel group 20 of FIG. 2. Referring to FIG. 4, the first sub-pixel 22 may be set up as the red sub-pixel R, the second sub-pixel 24 may be set up as the green sub-pixel G, and the third sub-pixel 26 may be set up as the blue sub-pixel B.

In general, the blue sub-pixel B in the organic light emitting display device has the shortest life property. Therefore, the third sub-pixel 26 that has the largest area may be set up as the blue sub-pixel B, so that the life property can be improved.

Figure 5:
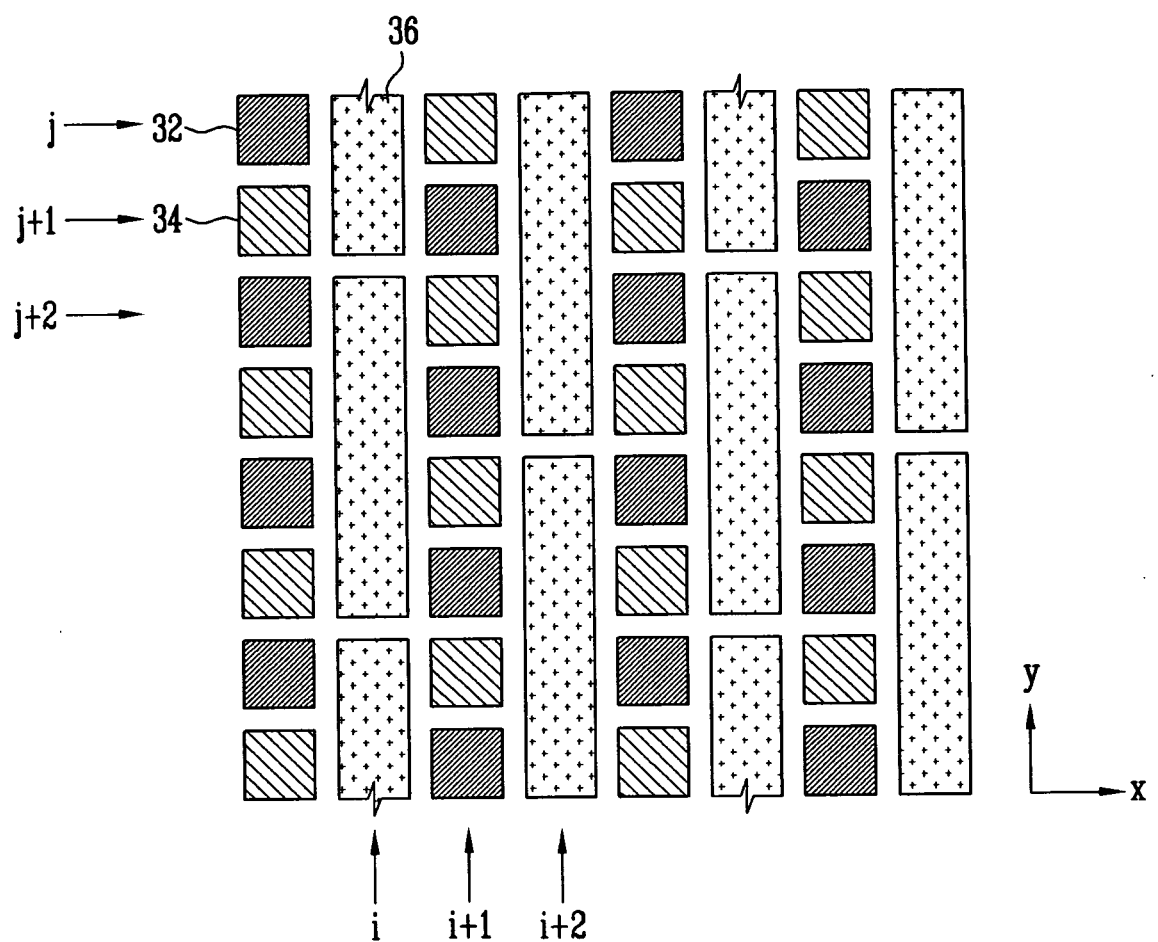
FIG. 5 illustrates a plan view of a pixel arrangement of an organic light emitting display device according to a third embodiment.

FIG. 5 illustrates a plan view of a pixel arrangement of an organic light emitting display device according to a third embodiment. Referring to FIG. 5, the pixel arrangement of the organic light emitting display device according to the third embodiment may include sub-pixels 32, 34, 36.

The first sub-pixel 32 may emit light having the first color, the second sub-pixel 34 may emit light having the second color, and the third sub-pixel 36 may emit light having the third color. The first sub-pixel 32, the second sub-pixel 34, and the third sub-pixel 36 may be repeatedly arranged in a constant pattern.

The first sub-pixel 32 and the second sub-pixel 34 may be alternately arranged in a same column line and row line, as described previously with reference to FIG. 1. The third sub-pixel 36 may be arranged in a column line adjacent to the column line of the first sub-pixels 32 and the second sub-pixels 34. The first sub-pixels 32 and the second sub-pixels 34 may be arranged in a diagonal direction among the first sub-pixels 32 and among the second sub-pixels 34 around the columns of the third sub-pixels 36, as further described previously with reference to FIG. 1.

According to the third embodiment, one third sub-pixel 36 may be formed to correspond to, e.g., overlap, four rows of the alternating first sub-pixels 32 and second sub-pixel 34. In this case, a height of the third sub-pixels 36 may be at least four times longer than the first sub-pixel 32 (or the second sub-pixel 34) along the first direction, e.g., the third sub-pixel 36 may have a wider area than the first sub-pixel 32 and the second sub-pixel 34. In addition, the third sub-pixels 36 arranged in i-th column (here, i is 2, 6, 10 . . . ) may be formed to share two row lines with the third sub-pixels 36 arranged in the (i+2)-th column. In other words, alternating columns of the third sub-pixels 36 may be offset with respect to each other, so that adjacent third sub-pixels 36 in adjacent columns may overlap only in two of the four rows, e.g., each third sub-pixel 36 arranged in the i-th column may overlap two halves of two different third sub-pixels 36 in the (i+2)-th column.

For example, one of the first sub-pixel 32 and one of the second sub-pixel 34 may be sequentially arranged along the first direction in alternating columns i−1, i+1, i+3, etc, and each third sub-pixel 36 may be arranged to overlap four rows, i.e., four alternating first and second sub-pixels 32 and 34 within a single column, in alternating columns i, i+2, i+4, etc. In detail, as illustrated in FIG. 5, a third sub-pixel 36 in the i-th column may overlap the alternating first and second sub-pixels 32 and 34 in positions (j+2) through (j+5) within the (i−1)-th column, while a third sub-pixel 36 in the (i+2)-th column may overlap the alternating first and second sub-pixels 32 and 34 in positions (j) through (j+4) within the (i+1)-th column. In this case, the third sub-pixels 36 arranged in the i-th row and the (i+2)-th row may share two rows.

According to the third embodiment, one of the third sub-pixels 36 corresponding to two of the first sub-pixels 32 (or the second sub-pixels 34) may be formed. In this case, one data signal may be supplied to the third sub-pixel 36, during supply of two data signals to the first sub-pixel 32. The data signal may be supplied in any suitable manner.

For example, one data signal may be produced by the equalization of two data gray levels that is to be supplied to the third sub-pixel 36, and then the produced data signal may be supplied to the third sub-pixel 36. Data in adjacent sub-pixels may be set up as the equal gray level. Therefore, even if the data signal is produced by the equalization of two data gray levels, the desired image may be displayed. In addition, using a similar or same method with "The Pentile Matrix Color Pixel Arrangement" suggested by "ClairVoyante Laboratories" company may supply the data signal.

Figure 6:
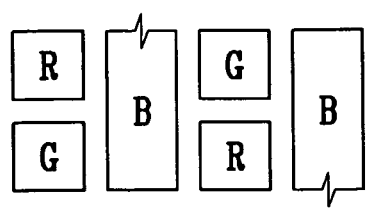
FIG. 6 illustrates a plan view of an example of a color arrangement that can be applied in a sub-pixel group of FIG. 5.

FIG. 6 illustrates a plan view of an example of a color arrangement that may be applied in a sub-pixel group of FIG. 5. Referring to FIG. 6, the first sub-pixel 32 may be set up as the red sub-pixel R, the second sub-pixel 34 may be set up as the green sub-pixel G, and the third sub-pixel 36 may be set up as the blue sub-pixel B.

In general, the blue sub-pixel B in the organic light emitting display device has the shortest life property. Therefore, according to the third embodiment, the third sub-pixel having the largest area may be set up as the blue sub-pixel B, so that the life property can be improved.

Figure 7:
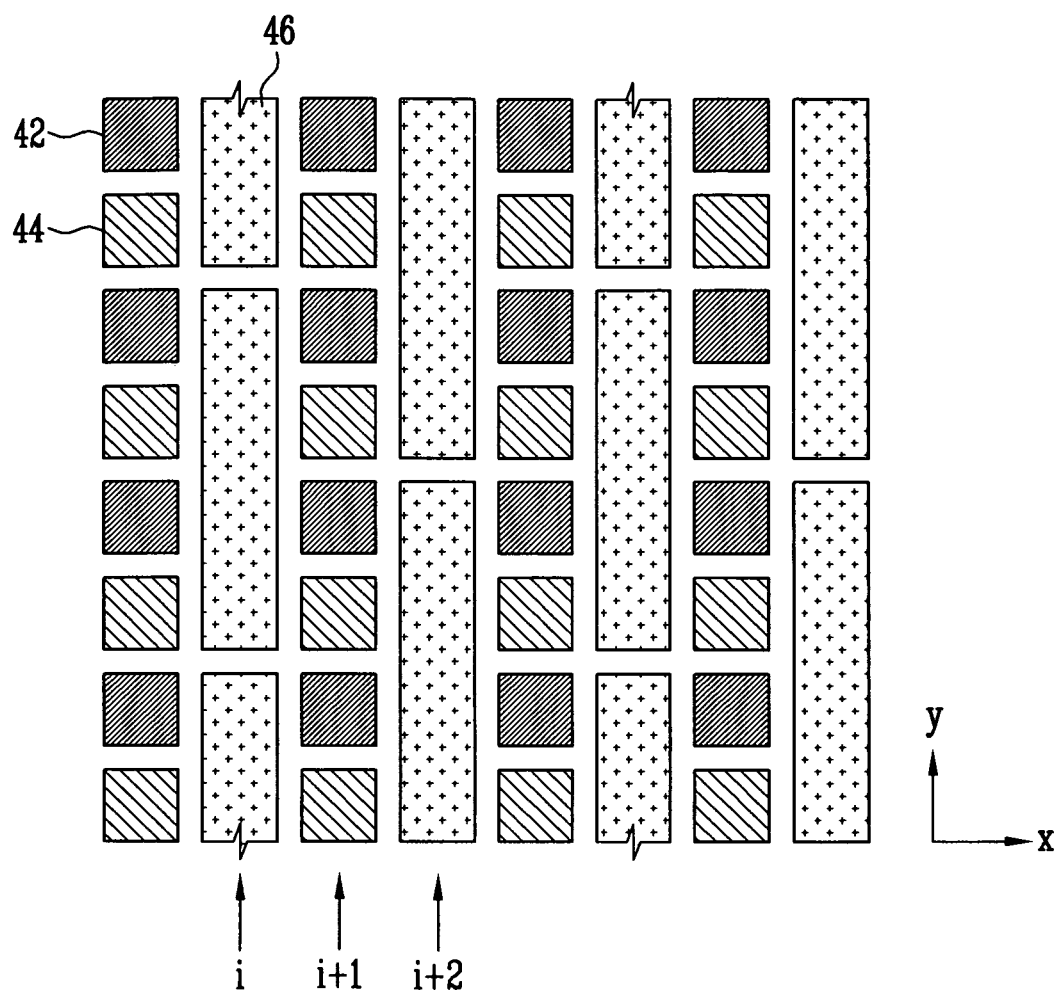
FIG. 7 illustrates a plan view of a pixel arrangement of an organic light emitting display device according to a fourth embodiment.

FIG. 7 illustrates a plan view of a pixel arrangement of an organic light emitting display device according to a fourth embodiment. As the fourth embodiment is similar to the third embodiment described previously with reference to FIG. 5, mostly differences between the third and fourth embodiments will be explained hereinafter.

Referring to FIG. 7, a first sub-pixel 42 emits light having the first color, a second sub-pixel 44 emits light having the second color, and a third sub-pixel 46 emits light having the third color. The first sub-pixel 42, the second sub-pixel 44, and the third sub-pixel 46 may be repeatedly arranged in a constant pattern.

For example, the first sub-pixel 42 and the second sub-pixel 44 may be alternately arranged in a same column line, and the third sub-pixel 46 may be arranged in a column line adjacent to a column of the alternating first sub-pixels 42 and second sub-pixels 44. Further, the first sub-pixels 42 may be arranged in a same row line, so the third sub-pixels 46 may be arranged therebetween. Similarly, the second sub-pixels 44 may be arranged in a same row line, so the third sub-pixels 46 may be arranged therebetween.

The third sub-pixels 46 may be formed in four row lines to be adjacent to the first sub-pixel 42 and the second sub-pixel 44, respectively. In this case, the height of the third sub-pixels 46 may be at least four times longer than the first sub-pixel 42 (or the second sub-pixel 44) along the column direction, e.g., the third sub-pixels 46 may have a wider area than the each of the first sub-pixel 42 and the second sub-pixel 44. In addition, the third sub-pixels 46 arranged in i-th column may share two row lines with the third sub-pixels 46 arranged in the (i+2)-th row, as described previously with respect to the third embodiment.

Figure 8:
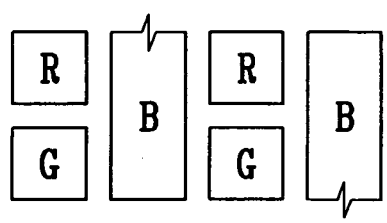
FIG. 8 illustrates a plan view of an example of a color arrangement that can be applied in a sub-pixel group of FIG. 7.

FIG. 8 illustrates a plan view of an example of a color arrangement that may be applied in a sub-pixel group of FIG. 7. Referring to FIG. 8, the first sub-pixel 42 may be set up as a red sub-pixel R, the second sub-pixel 44 may be set up as a green sub-pixel G, and the third sub-pixel 46 may be set up as a blue sub-pixel B.

In general, the blue sub-pixel B in the organic light emitting display device has the shortest life. Therefore, the life property may be improved by setting up the third sub-pixel 46 as the blue sub-pixel B, in which the third pixel 46 has the largest area according to example embodiments.

Figure 9:
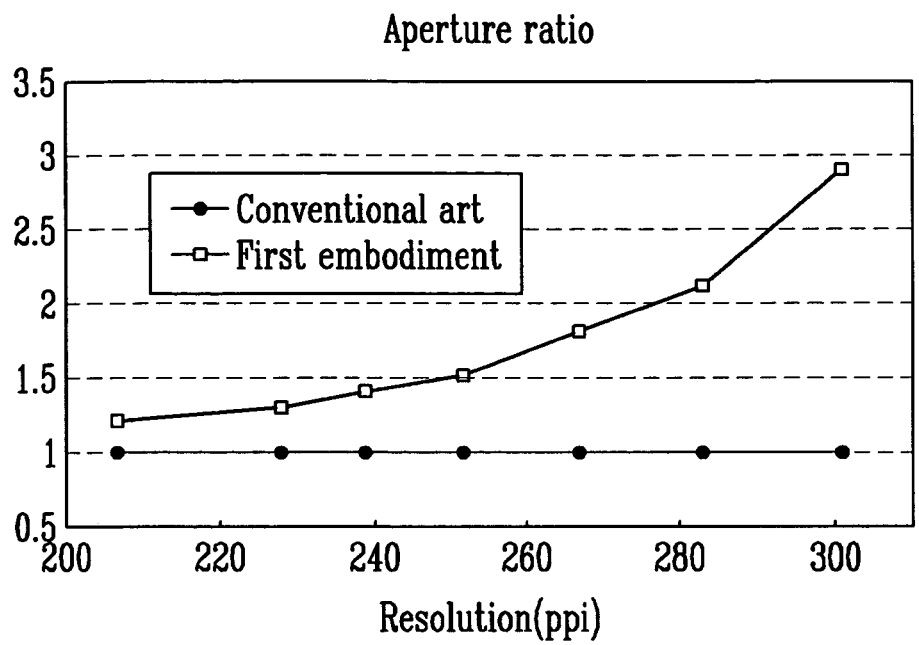
FIG. 9 and FIG. 10 illustrate comparison graphs of aperture ratios in a pixel arrangement according to an embodiment and according to a conventional stripe configuration.
Figure 10:
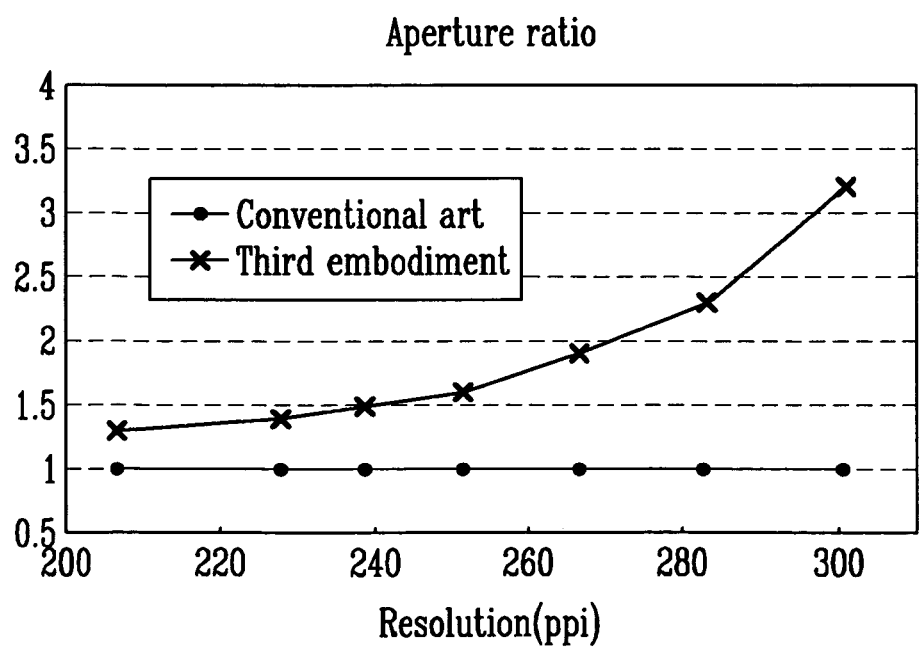

FIG. 9 and FIG. 10 illustrate graphs comparing aperture ratios between a pixel arrangement according to an example embodiment and a conventional stripe pixel arrangement. FIG. 9 illustrates comparison results with respect to a pixel arrangement according to the first embodiment illustrated in FIG. 1, and FIG. 10 illustrates comparison results with respect to a pixel arrangement according to the third embodiment illustrated in FIG. 5.

Referring to FIG. 9 and FIG. 10, when the sub-pixels are arranged in the pixel arrangement according to the first and the third embodiments, high aperture ratio may be secured as compared with the arrangement of the conventional stripe configuration. Especially, if the high-resolution is high, aperture ratio may increase to further secure high-resolution, so that improved resolution may be implemented.

A pixel arrangement of an organic light emitting display device according to an embodiment may include alternating first and second sub-pixels in a same column, and a third sub-pixel in an adjacent column and overlapping at least two rows of the alternating first and second sub-pixels. As such, the aperture ratio may be improved and high-resolution may be increased. In contrast, when red sub-pixels, green sub-pixels, and blue sub-pixels are arranged in a conventional stripe configuration, i.e., where pixels having the same color are arranged in a same row, the aperture ratio may be reduced and the expression capability of the high-resolution may be decreased due to a black matrix arranged between every sub-pixels.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A pixel arrangement of an organic light emitting display device with a plurality of repeatedly arranged sub-pixel groups, each of the sub-pixel groups comprising:
    two first sub-pixels in i-th and (i+2)-th columns (i is a natural number);
    two second sub-pixels in the i-th and (i+2)-th columns, the second sub-pixels being arranged in different rows with respect to the first sub-pixels; and
    two third sub-pixels in (i+1)-th and (i+3)-th columns, each third sub-pixel overlapping at least two adjacent rows of the first and second sub-pixels,
    wherein the (i+1)-th and (i+3)-th columns include only the third sub-pixels,
    wherein the third sub-pixel is at least two times longer than the first sub-pixel along a column direction, and
    wherein the first sub-pixels and the second sub-pixels are alternately arranged in a same column and are alternately arranged in a same row, the i-th and (i+2)-th columns including only the first and second sub-pixels.

2. The pixel arrangement of the organic light emitting display device as claimed in claim 1, wherein the third sub-pixel is wider than the first sub-pixel.

3. The pixel arrangement of the organic light emitting display device as claimed in claim 1, wherein the third sub-pixel is a blue sub-pixel, the first sub-pixel is a red sub-pixel, and the second sub-pixel is a green sub-pixel.

4. The pixel arrangement of the organic light emitting display device as claimed in claim 1, wherein the first sub-pixels and the second sub-pixels are arranged in separate adjacent rows.

5. A pixel arrangement of an organic light emitting display device, comprising:
    first and second sub-pixels arranged alternately in a plurality of columns, the first and second sub-pixels being configured to emit different colors; and
    third sub-pixels between adjacent columns of alternating first and second sub-pixels, each third sub-pixel overlapping four alternating first and second sub-pixels within a same column.

6. The pixel arrangement of the organic light emitting display device as claimed in claim 5, wherein third sub-pixels in adjacent columns overlap only partially.

7. The pixel arrangement of the organic light emitting display device as claimed in claim 6, wherein each third sub-pixel overlaps a portion of a third sub-pixel in an adjacent column that correspond to two alternating first and second sub-pixels within a same column.

8. The pixel arrangement of the organic light emitting display device as claimed in claim 5, wherein the third sub-pixel is wider than the first sub-pixel.

9. The pixel arrangement of the organic light emitting display device as claimed in claim 5, wherein the third sub-pixel is set up as a sub-pixel with the shortest life property among a red sub-pixel, a green sub-pixel, and a blue sub-pixel.

10. The pixel arrangement of the organic light emitting display device as claimed in claim 5, wherein the third sub-pixel is a blue sub-pixel, the first sub-pixel is a red sub-pixel, and the second sub-pixel is a green sub-pixel.

11. The pixel arrangement of the organic light emitting display device as claimed in claim 5, wherein the first sub-pixels and the second sub-pixels are alternately arranged in a same row.

12. The pixel arrangement of the organic light emitting display device as claimed in claim 5, wherein the first sub-pixels and the second sub-pixels are arranged in separate rows adjacent to each other.

13. The pixel arrangement of the organic light emitting display device as claimed in claim 1, wherein the third sub-pixels are blue.

14. The pixel arrangement of the organic light emitting display device as claimed in claim 1, wherein the first sub-pixels are of a same color, the second sub-pixels are of a same color different than the color of the first sub-pixels, and the third sub-pixels are of a same color different than the color of each of the first and second sub-pixels.

15. The pixel arrangement of the organic light emitting display device as claimed in claim 1, wherein the third sub-pixel has a larger area than either of the first and second sub-pixels.

16. The pixel arrangement of the organic light emitting display device as claimed in claim 1, wherein the third sub-pixel is a sub-pixel with a shortest life among the first through third sub-pixels.

* * * * *